United States Patent [19]

Okumura et al.

[11] Patent Number: 5,629,962

[45] Date of Patent: May 13, 1997

[54] PHASE LOCKED LOOP CIRCUIT

[75] Inventors: Naoji Okumura, Mino; Masaaki Fujita, Takatsuki, both of Japan

[73] Assignee: Matsushita Electric Industrial Co., Ltd., Kadoma, Japan

[21] Appl. No.: 8,797

[22] Filed: Jan. 27, 1993

[30] Foreign Application Priority Data

Jan. 28, 1992 [JP] Japan ................. 4-013006

[51] Int. Cl.$^6$ .................. H03L 7/06; H03L 7/16; H03L 7/18

[52] U.S. Cl. .................. 375/376; 331/17; 331/16; 331/25; 375/327

[58] Field of Search ............. 375/81, 376, 327; 331/16, 17, 25; 348/512, 513, 536, 540; 455/260

[56] References Cited

U.S. PATENT DOCUMENTS

| 4,597,019 | 6/1986 | Nishimoto . | |
|---|---|---|---|
| 4,729,024 | 3/1988 | Kawai et al. | 348/540 |
| 4,812,783 | 3/1989 | Honjo et al. | 331/20 |
| 5,019,907 | 5/1991 | Murakoshi et al. . | |
| 5,068,731 | 11/1991 | Takeuchi . | |
| 5,079,526 | 1/1992 | Heck | 375/81 |
| 5,097,219 | 3/1992 | Itoh | 328/155 |
| 5,168,360 | 12/1992 | Maeshima | 348/536 |
| 5,206,726 | 4/1993 | Okuda . | |

FOREIGN PATENT DOCUMENTS

| 465225 | 1/1992 | European Pat. Off. . |
| 3-52465 | 3/1991 | Japan . |
| 4-103280 | 4/1992 | Japan . |
| 4-103279 | 4/1992 | Japan . |

OTHER PUBLICATIONS

Patent Abstract of Japan, vol. 14 No. 139 (E-903) Mar. 1990 re JP-A 2004087.

Patent Abstract of Japan, Vo. 16 No. 112 (E-119) Mar. 1992 re JP-A 3284062.

*Primary Examiner*—Wellington Chin
*Assistant Examiner*—Jean B. Corrielus
*Attorney, Agent, or Firm*—Cushman, Darby & Cushman IP Group of Pillsbury Madison & Sutro LLP

[57] ABSTRACT

A phase locked loop circuit comprises a divider which is changed in a dividing ratio in compliance with a control signal applied thereto, the output of the divider is phase-compared with an input signal of the phase locked loop circuit. A phase-compared output is applied to a low pass filter to obtain a direct current component, and an oscillator is controlled by the direct current component.

1 Claim, 3 Drawing Sheets

PHASE LOCKED LOOP CIRCUIT

FIELD OF THE INVENTION AND RELATED ART

1. Field of the Invention

The present invention relates generally to a phase locked loop circuit (hereinafter abbreviated as PLL circuit), and more particularly to a PLL circuit which is used in a circuit for converting an aspect ratio in a video display.

2. Description of the Related Art

An aspect ratio of the video display in the NTSC television system is 4 to 3 (hereinafter is referred to as "4:3") as is generally known. In the case that the video image of the aspect ratio 4:3 is displayed in a video display of the aspect ratio "16:9" in the high definition television system, the aspect ratio 4:3 must be maintained on the video display of the aspect ratio 16:9 by reducing a horizontal display range on the video display.

There are various aspect ratios in video apparatus. For example, the aspect ratios of the video images in video tape recorders are different from each other In every video tape recording systems. On the other hand, the aspect ratio of the video image in a video disc recording system is different from that of the video tape recording system.

As mentioned above, in the ease that a video image of various video systems having various aspect ratios is displayed on the video display of the aspect ratio 16:9, a horizontal display range based on a horizontal scanning operation is reduced with a ratio corresponding to the respective aspect ratios. Consequently, the aspect ratio of the video image which is displayed on the video display of the aspect ratio 16:9 is equalized to the aspect ratio of an original video image, and is displayed without distortion in image. The reduction of the display range in the horizontal scanning range is called "horizontal compression", and a circuit therefor is called a "horizontal compression circuit".

In conventional horizontal compression circuits, first, a video signal is converted into a digital signal by an analog to digital converter. The digitized video signal is separated into a luminance signal (Y) and two kinds of color difference signals (R-Y) and (B-Y) by a signal separation circuit. The separated luminance signal (Y) and the color difference signals (R-Y) and (B-Y) are stored in the respective memories. Each memory has a capacity to record data of one scanning line of the luminance signal (Y), the color difference signal (R-Y) or the color difference signal (B-Y), and the data of one scanning line is recorded in synchronism with a "write clock signal" which is applied to each write terminal of each memory.

Each recorded data is read out in synchronism with a "read clock signal" which is applied to each read terminal of each memory. Consequently, when the frequency of the read clock signal is different from the frequency of the write clock signal, the read time of the data of one scanning line is varied with respect to the write time.

The write operation and read operation in each memory is elucidated hereafter. A first PLL circuit generates the write clock signal in synchronism with a horizontal synchronizing signal of the video signal. The frequency $f_a$ of the write clock signal is 910 times of the frequency of the horizontal synchronizing signal, for example. The write clock signal is applied to the write terminals of the memories, and the data of the luminance signal (Y), color difference signal (R-Y) and the color difference signal (B-Y) are stored in the respective memories in synchronism with the write clock signal. Each data represents the signal of one scanning line of the luminance signal (Y), the color difference signal (R-Y) or the color difference signal (B-Y).

Subsequently, in a second PLL circuit, the read clock signal of a frequency $f_b$ is generated in synchronism with the horizontal synchronizing signal, and is applied to the read terminals of the memories. Consequently, the data stored in each memory is read out in synchronism with the read clock signal. Each signal which is read out from each memory is converted to an analog signal, and is applied to an image display circuit.

In the above-mentioned circuit, in such a case that the video image of the aspect ratio 4:3 is displayed on the video display of the aspect ratio 16:9, for example, the frequency $f_b$ is selected so that the ratio ($f_a/f_b$) of the write clock frequency $f_a$ to the read clock frequency $f_b$ becomes equal to a ratio (3/4). Consequently, the video image of the aspect ratio 4:3 is displayed in the range of 3/4 or 75% of the entire horizontal display range on the video display of the aspect ratio 16:9. An example of the display is shown in FIG. 3. Referring to FIG. 3, a video image 33 of the aspect ratio 4:3 is displayed on the central portion of the video display 31 of the aspect ratio 19:6 by adjusting timing of the horizontal scanning operation, and blank portions 34 and 35 having no image are produced on left and right end portions.

In the horizontal compression circuit in the above-mentioned prior art, the conventional PLL circuit generates the signal at a frequency fixed to a constant value. Therefore, in order to display the video images of the various video apparatus which are different in the aspect ratio on the video display of the aspect ratio 16:9 of the high definition television system, a plurality of the second PLL circuits must be provided to generate the read clock signals which are different in frequency corresponding to each aspect ratio. Therefore, a circuit configuration is complicated and a fabrication cost is increased.

OBJECT AND SUMMARY OF THE INVENTION

An object of the present invention is to provide a PLL circuit which oscillates a clock signal at a variable frequency in synchronism with the horizontal synchronizing signal of a video signal.

The PLL circuit in accordance with the present invention comprises:

divider means for dividing a frequency of an input signal to a frequency designated by a control signal which is applied to a control signal input terminal of the divider means and represents a dividing ratio, a phase comparator for comparing the phase of the horizontal synchronizing signal of a video signal with the phase of a signal divided by the divider means, and thereby outputting a compared output, low pass filter means for extracting a direct current component from the compared output of the phase comparator, and oscillation means for oscillating an output signal of a frequency which is controlled in a manner to be equal to the product of the frequency of the horizontal synchronizing signal by the dividing ratio on the basis of the direct current component of the low pass filter, and for applying the output signal to the divider means.

While the novel features of the invention are set forth particularly in the appended claims, the invention, both as to organization and content, will be better understood and appreciated, along with other objects and features thereof,

DESCRIPTION OF THE PREFERRED EMBODIMENTS

Figure 1:
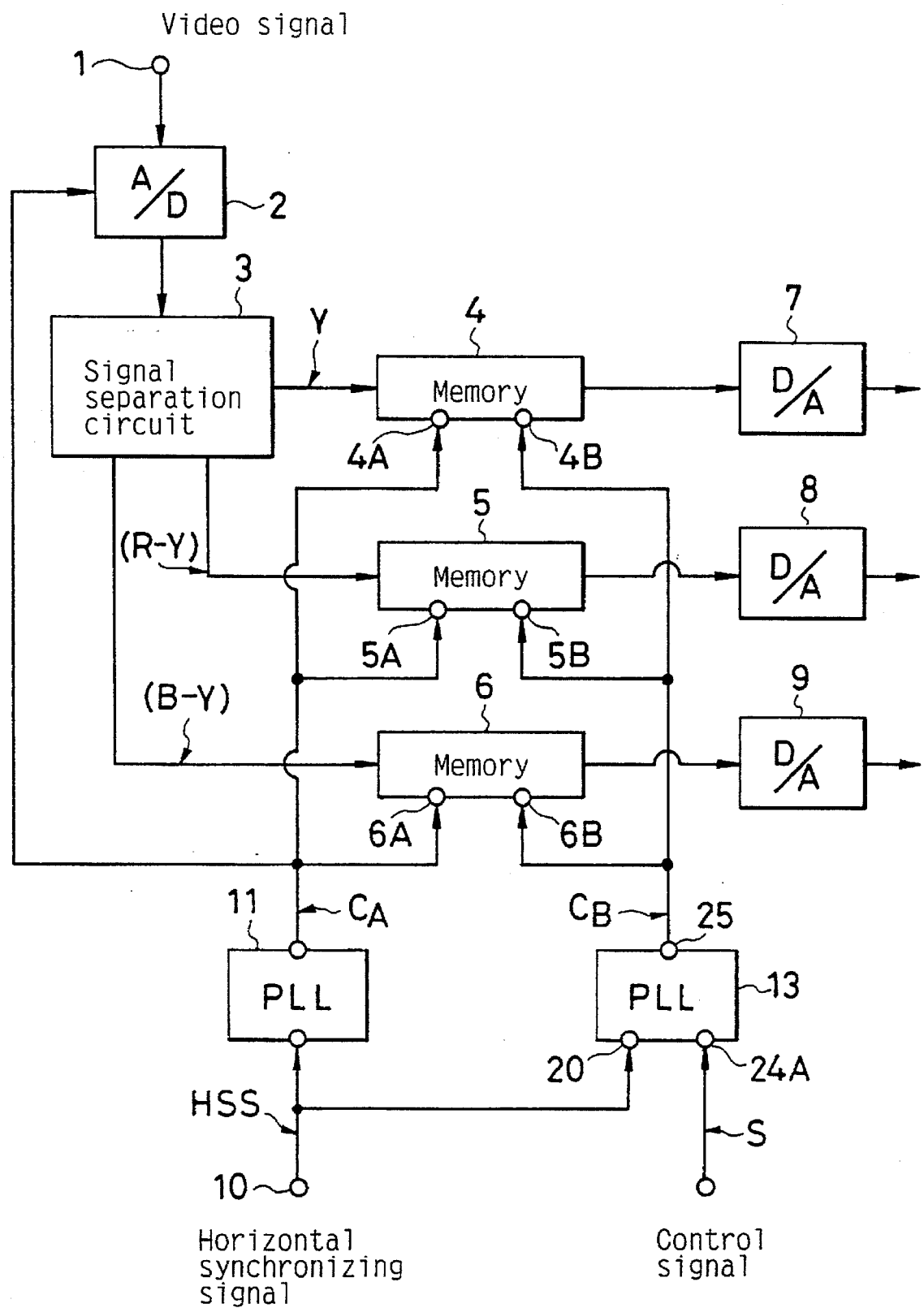
FIG. 1 is a block diagram of a horizontal compression circuit using a PLL circuit in accordance with the present invention.

FIG. 1 is a block diagram of a horizontal compression circuit using a PLL circuit in accordance with the present invention. Referring to FIG. 1, a video signal is inputted to an analog to digital converter 2 (hereinafter abbreviated as A/D converter) at a terminal 1 thereof, and is converted into a digital signal with a predetermined sampling frequency.

The digitized video signal is applied to a signal separation circuit 3, and is separated to a luminance signal (Y), a color difference signal (R-Y) and a color difference signal (B-Y). The luminance signal (Y) is inputted to a memory 4, and the color difference signals (R-Y) and (B-Y) are inputted to the memories 5 and 6, respectively. The memories 4, 5 and 6 have capacities to store the data of one scanning line of the respective signals.

A horizontal synchronizing signal HSS of the video signal is inputted to a PLL circuit 11 at the input terminal 10; and a "write clock signal $C_A$" of a frequency $f_A$ which is 910 times of the frequency of the horizontal synchronizing signal HSS, for example, is output in synchronism with the horizontal synchronizing signal HSS. The value 910 represents the number of samples with respect to one scanning line and it is a ratio the times the subcarrier frequency (3,579545 MHz) of the color signal in the NTSC television system to the frequency (15,734264 KHz) of the horizontal synchronizing signal (4×3,579545 (MHz)/15,734264 (KHz)=910). The value 910 is suitable to practical use.

The write clock signal $C_A$ is applied to write clock input terminals 4A, 5A, and 6A of the memories 4, 5 and 6, respectively. The luminance signal (Y), the color difference signals (R-Y) and (B-Y) are stored in the memories 4, 5 and 6 in synchronism with the write clock signal $C_A$, respectively.

The horizontal synchronizing signal HSS is also applied to a PLL circuit 13, and a "read clock signal $C_B$" is generated in synchronism with the horizontal synchronizing signal HSS. The frequency $f_B$ of the read clock signal $C_B$ is changed by a control signal S which is applied to a control signal input terminal 24 of the PLL circuit 13. The read clock signal $C_B$ is applied to the read terminals 4B, 5B and 6B of the memories 4, 5 and 6, respectively.

The data which are written to the memories 4, 5 and 6 in synchronism with the write clock signal $C_A$ are read out in synchronism with the read clock signal $C_B$, and are applied to respective digital to analog converters (hereinafter abbreviated as D/A converter) 7, 8 and 9. The signals read out from the memories 4, 5 and 6 are converted to analog signals by the D/A converters 7, 8 and 9, respectively, and are applied to video image display circuits which are not shown in FIG. 1.

Figure 2:
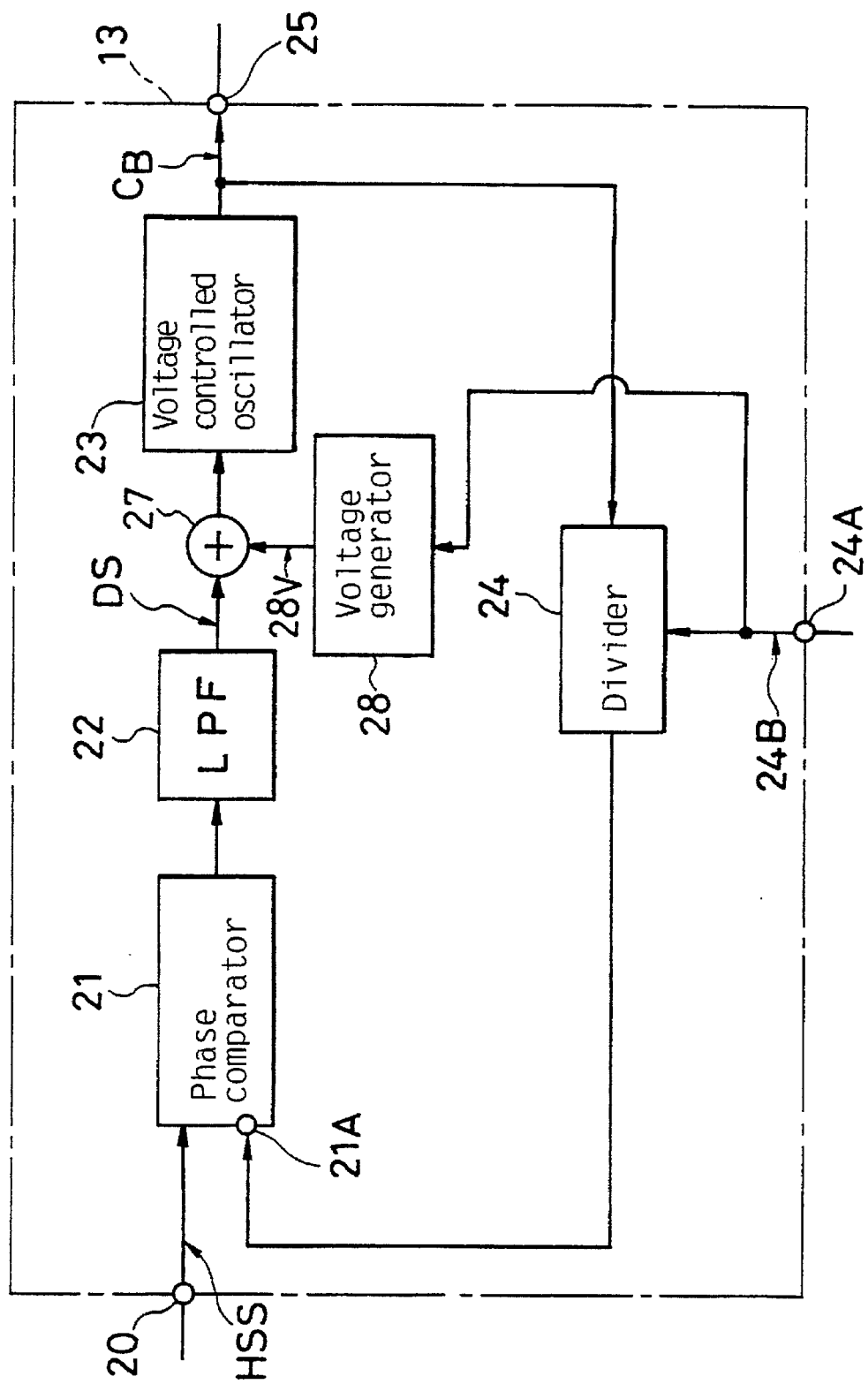
FIG. 2 is a detailed block diagram of the PLL circuit of the present invention.

FIG. 2 is a detailed block diagram of the PLL circuit 13 in the embodiment of the present invention. Referring to FIG. 2, the horizontal synchronizing signal HSS is applied to an input terminal 20 of a phase comparator 21. An output of a divider 24 is applied to a terminal 21A of the phase comparator 21. The phase comparator 21 compares phases of both inputs with each other, and issues a phase difference signal which represents the difference of phase between the horizontal synchronizing signal HSS and the output signal of the divider 24. The phase difference signal is applied to a low pass filter 22, which issues a direct current signal DS whose voltage responds the phase difference. The DC current signal DS is applied to an oscillator 23. The voltage of the direct current signal DS is a predetermined negative value when both the inputs are in the same phase, or is a positive value, which is equal to the negative value, in absolute value when both the inputs are in opposite phase with each other. When both the inputs have 90° of phase difference, the voltage of the direct current signal DS is zero. The direct current signal DS is applied to a voltage controlled oscillator 23 through an adder 27. In the adder 27, the voltage of the direct current signal DS is added to the output voltage 28V of a voltage generator 28. The output voltage 28V has a value determined on the basis of the control input signal 24B representing numeral data of the dividing ratio, and is applied to the voltage controlled oscillator 23 through the adder 27.

The voltage controlled oscillator 23 comprises an oscillating circuit whose frequency is controlled by the direct current signal DS given thereto. In the present embodiment, a basic oscillation frequency of the voltage controlled oscillator 23 is decided by the output voltage 28V. Moreover, the basic oscillation frequency is controlled within a small range by the direct current signal DS for fine adjustment of the phase, and thus an output signal having a constant frequency and a phase is obtained. The oscillation frequency is inversely proportional to the output voltage 28V, and when the output voltage increases the oscillation frequency decreases, for example. The output of the oscillator 23 is issued to a terminal 25 as the read clock signal $C_B$ and is applied to the divider 24.

The divider 24 comprises a control input terminal 24A, and a dividing ratio of the divider 24 is changed in compliance with a control Input signal 24B which is applied to the control input terminal 24A. Such divider 24 is composed essentially of a presettable counter. The control input signal 24B is a numeral data for designating the dividing ratio.

Figure 3:
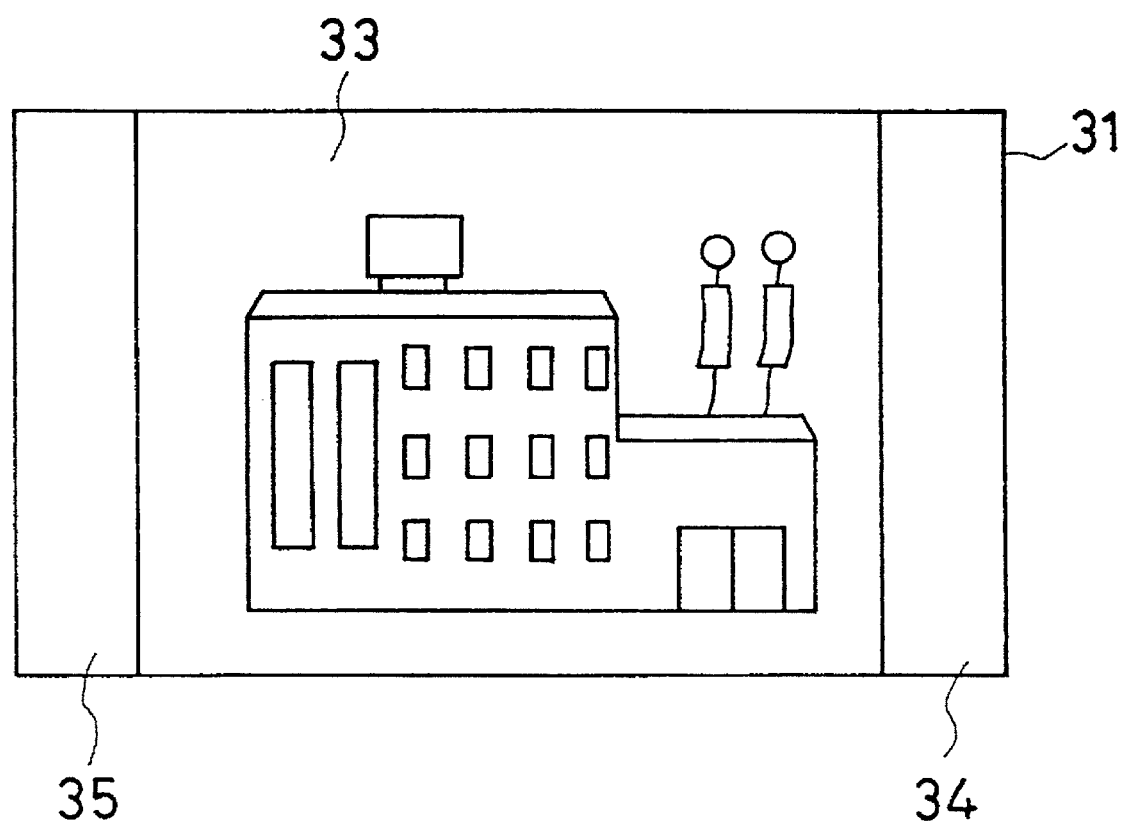
FIG. 3 is a front view of a video display which displays a video image of the aspect ratio 4:3 on a video display of the aspect ratio 16:9.

In the embodiment of the present invention, when the video image of the aspect ratio 4:3 is displayed on the video display of the aspect ratio 16:9, for example, the frequency $f_B$ of the read clock signal $C_B$ is selected so that the ratio ($f_A/f_B$) of the frequencies $f_A$ to $f_B$ becomes equal to a ratio (3/4). For example, when the number of sample of one scanning line is 910, the frequency $f_A$ of the write clock signal $C_A$ is (15,734264×910) KHz, and further the dividing ratio is (910×4/3). The control input signal 24B representing the dividing ratio (910×4/3) is applied to the divider 24 and the voltage generator 28. The voltage controlled oscillator 23 generates the signal of (15,734264×910×4/3) KHz of frequency according to the output voltage 28V representing the dividing ratio (910×4/3). Consequently, the video image of the aspect ratio 4:3 is displayed in the range of 3/4 of the entire horizontal display range on the video display of the aspect ratio 16:9 as shown in FIG. 3. In FIG. 3, the video image 33 of the aspect ratio 4:3 is displayed in the central portion of the video display 31 of the aspect ratio 19:6, by adjusting a display timing in horizontal scanning. Consequently, blank portions 34 and 35 are generated on the both sides of the video display 31.

In the PLL circuit 13 of the present embodiment, the read clock signal $C_B$ of a desired read frequency $f_B$ is obtained by setting the control input signal 24B of the divider 24 to a desired value. Consequently, the aspect ratio in the display can be converted to a desired value by reading the data stored in the memories 4, 5 and 6 with the write clock signal $C_A$ by using the read clock signal $C_B$. Namely, video images of various video image sources which are different in the aspect ratio are displayed on the video display of the aspect ratio 19:6 by maintaining original aspect ratios thereof without distortion.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A phase locked loop circuit comprising:

divider means for dividing a frequency of an input signal to a frequency designated by an external control signal, said external control signal being independent of a video signal provided to said phase locked loop circuit and representing a dividing ratio of said divider means, said external control signal being applied to a control signal input terminal of said divider means, said divider means outputting a divided frequency signal;

a voltage generator for generating a voltage based on said external control signal representing said dividing ratio;

a phase comparator for comparing a phase of a horizontal synchronizing signal of said video signal with a phase of said divided frequency signal output by said divider means, and thereby outputting a compared output signal;

low pass filter means for extracting a direct current component from said compared output signal output by said phase comparator;

an adder for adding said voltage generated by said voltage generator to an output of said low pass filter means, an output of said adder being provided to said oscillation means; and oscillation means for outputting an oscillating signal having a frequency that equals a product of a frequency of said horizontal synchronizing signal and said dividing ratio, which is based on said direct current component output from said low pass filter, said oscillating signal being applied to said divider means.

* * * * *